United States Patent
Terada et al.

(10) Patent No.: US 8,786,317 B2
(45) Date of Patent: Jul. 22, 2014

(54) LOW VOLTAGE DETECTION CIRCUIT

(71) Applicants: Akihiro Terada, Ebina (JP); Shinichiro Maki, Hiratsuka (JP)

(72) Inventors: Akihiro Terada, Ebina (JP); Shinichiro Maki, Hiratsuka (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/658,958

(22) Filed: Oct. 24, 2012

(65) Prior Publication Data

US 2013/0099771 A1 Apr. 25, 2013

(30) Foreign Application Priority Data

Oct. 25, 2011 (JP) .................................. 2011-233475

(51) Int. Cl.
*H03K 5/153* (2006.01)
(52) U.S. Cl.
USPC ................... 327/77; 327/78; 327/85; 327/87; 327/205

(58) Field of Classification Search
USPC ............ 327/77, 78, 85, 87, 88, 143, 205, 206
See application file for complete search history.

(56) References Cited

U.S. PATENT DOCUMENTS 7,825,705 B2 * 11/2010 Kawakita ....................... 327/143
8,525,555 B2 * 9/2013 Kondo et al. .................... 327/77

FOREIGN PATENT DOCUMENTS

JP 09-116401 * 5/1997
JP 09-116401 A 5/1997

* cited by examiner

*Primary Examiner* — Long Nguyen
(74) *Attorney, Agent, or Firm* — Holtz Holtz Goodman & Chick PC

(57) ABSTRACT

Disclosed is a low voltage detection circuit. The low voltage detection circuit includes, a voltage comparison circuit, an output stage, an electric current circuit, and a judgment circuit. When the voltage comparison circuit detects that the voltage of the detection target is a predetermined voltage value or less, an output state of the output stage is promptly changed. When the voltage comparison circuit detects that the voltage of the detection target is a predetermined voltage value or more, the output state of the output stage is changed after a delay time obtained by the electric current circuit.

4 Claims, 3 Drawing Sheets

LOW VOLTAGE DETECTION CIRCUIT

BACKGROUND OF THE INVENTION

1. Field of the Invention

The present invention relates to a low voltage detection circuit which detects a low voltage state of a power supply voltage to output a reset signal. Specifically, the present invention relates to a technique which is effectively used in a low voltage detection circuit which includes a delay to change a reset signal to a cancel state by providing a predetermined delay time when canceled.

2. Description of Related Art

In a system including an IC (semiconductor integrated circuit), since there is a possibility of false operation of the IC if the power supply voltage decreases, measures are taken to stop the operation of the IC by providing a low voltage detection circuit which detects a low voltage state of the power supply voltage and outputs a signal to reset the system.

Conventionally, as shown in FIG. 5, a typical low voltage detection circuit including delay compares a voltage where a power supply voltage VDD is divided by resistor R1 and R2 with a reference voltage Vref with a comparator 13 and when the power supply voltage VDD is a predetermined electric potential or less, a transistor M4 is turned on to lower electric potential of node N1, the result is judged in a comparator CMP to turn on an output transistor M0 and an output voltage Vout is set to a low level (reset state). When the power supply voltage VDD is a predetermined electric potential or more, the transistor M4 is turned off, the output transistor M0 is turned off with the comparator CMP and the output voltage Vout is set to a high level (cancel state). Then, when the output transistor M0 is turned off, output is changed after a predetermined delay time determined by resistor Rd and time constant of the condenser connected to an external terminal CD so that the IC can start operation in a state where the power source voltage is stable.

However, in a low voltage detection circuit including delay as shown in FIG. 5, there are problems such as variation in delay time according to variation in resistor Rd and temperature attributes. In view of the above, in practical use, a low voltage detection circuit including delay is provided with a constant current circuit including a constant current source and a current mirror circuit which turns back the electric current of the constant current source and a delay time where influence from variation of elements and temperature attributes is low can be set by charging a condenser connected to an external terminal at the constant current circuit (for example, see Japanese Unexamined Patent Application Publication No. H09-116401).

According to the low voltage detection circuit using a current mirror circuit as proposed in the invention of Japanese Unexamined Patent Application Publication No. H09-116401, since an electric current is constantly flown in the constant current source of the current mirror circuit, there is a problem that the consumed electric current increases. Therefore, there may be a technique as shown in FIG. 6, where a switch SW1 is provided in series with a constant current source CI2 and the switch SW1 is turned on and off with output of a comparator 13 to suppress consumption of electric current. The structure in FIG. 6 uses a MOSFET as the transistor composing the circuit and does not include a manual reset function, but the basic structure is similar to that of Japanese Unexamined Patent Application Publication No. H09-116401.

According to the low voltage detection circuit shown in FIG. 6, while the power supply voltage VDD is a predetermined electric potential or less, the switch SW1 is turned off and it is possible to not flow electric current in the constant current source. However, when the power supply voltage VDD is a predetermined electric potential or more and the output transistor M0 is turned on after a predetermined delay time, the switch SW1 continues to be turned on. Therefore, an electric current flows to the constant current source C12 for a relatively long period of time, and there is a problem that it is not possible to sufficiently suppress the consumption of electric current.

SUMMARY OF THE INVENTION

The present invention has been conceived in view of the above, and an object of the present invention is to be able to suppress consumption of electric current by not flowing electric current of the constant current source after the output is a cancel state when a predetermined amount of time passes with the power source voltage being a predetermined electric potential or more in a low voltage detection circuit including a delay in which a delay time is set so that the delay time does not receive influence of variation in element or temperature attributes by charging a condenser with a constant current.

According to an aspect of the present invention, there is provided a low voltage detection circuit including:

a voltage comparison circuit which compares a voltage in proportion to a voltage of a detection target with a predetermined reference voltage;

an output stage which outputs a detection result;

an electric current circuit which includes a constant current source and which obtains a predetermined delay time by charging a condenser with a constant current; and a judgment circuit which judges that a charging electric potential of the condenser reaches a predetermined electric potential, wherein when the voltage comparison circuit detects that the voltage of the detection target is a predetermined voltage value or less, an output state of the output stage is promptly changed;

when the voltage comparison circuit detects that the voltage of the detection target is a predetermined voltage value or more, the output state of the output stage is changed after a delay time obtained by the electric current circuit;

when the voltage comparison circuit detects that the voltage of the detection target is a predetermined voltage value or less, the electric current circuit is set to a state in which the electric current of the constant current source is cut; and when the voltage comparison circuit detects that the voltage of the detection target is a predetermined voltage value or more, the electric current circuit is set to a state in which the electric current of the constant current source is flown, the charging of the condenser is started, and a control signal from the judgment circuit cuts the electric current flown in the constant current source after the delay time.

BRIEF DESCRIPTION OF THE DRAWINGS

The above and other objects, advantages, and features of the present invention will become more fully understood from the detailed description given hereinbelow and the appended drawings which are given by way of illustration only, and thus are not intended as a definition of the limits of the present invention, wherein.

DESCRIPTION OF THE PREFERRED EMBODIMENTS

A preferable embodiment of the present invention is described below with reference to the drawings.

Figure 1:
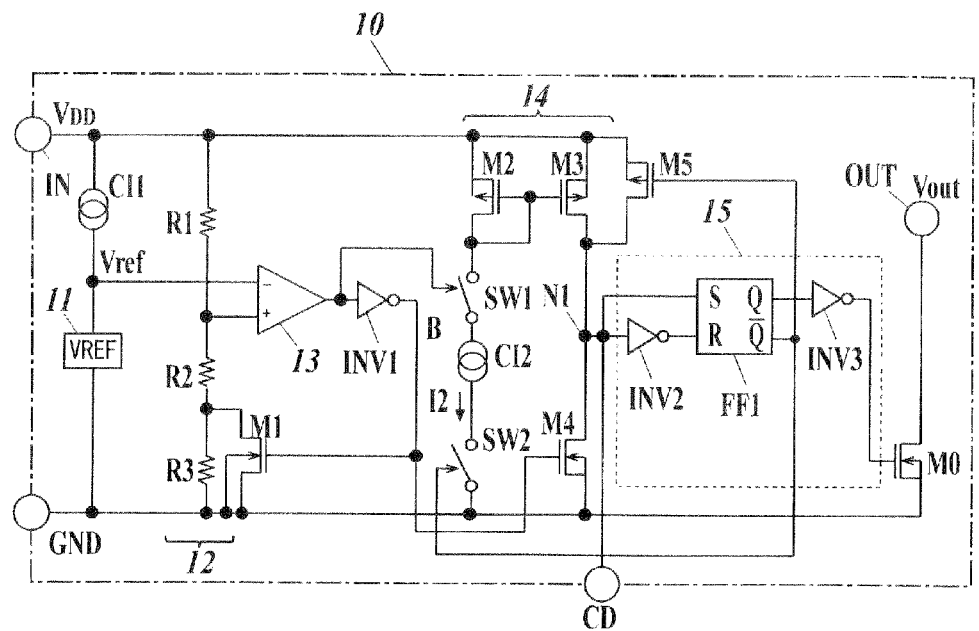
FIG. 1 is a circuit structure diagram showing an embodiment of a low voltage detection circuit (reset IC) of the present invention.

FIG. 1 shows an embodiment of a low voltage detection circuit including delay (hereinafter simply referred to as a low voltage detection circuit) employing the present invention. The element composing the circuit of the portion surrounded by a long and short dash line in FIG. 1 is formed on one semiconductor chip and is configured as one semiconductor integrated circuit (reset IC). However, the present invention is not limited to the above.

A reset IC which is a low voltage detection circuit 10 of the present embodiment is provided with a voltage input terminal IN where direct voltage VDD from a direct voltage source not shown is applied, a ground terminal GND where a ground potential is applied, an output terminal OUT to output a reset signal to an external device and an external terminal CD to connect an external condenser.

The low voltage detection circuit 10 is provided with a reference voltage circuit 11 which generates a reference voltage Vref, an electric current source CI1 which flows a constant current to the reference voltage circuit 11, a resistor voltage dividing circuit 12 which includes resistors R1, R2, and R3 connected in a series between the voltage input terminal IN and ground terminal GND to divide the direct voltage VDD, a comparator 13 as a voltage comparison circuit which compares a divided voltage and a reference voltage Vref, an output transistor M0 of an open drain where a drain terminal is connected to an output terminal OUT, a constant current circuit 14 which charges a condenser connected to the external terminal CD, and a judgment circuit 15 which detects charging voltage of the condenser to control on and off of the output transistor M0.

The output transistor M0 includes a N channel MOSFET (insulated gate field effect transistor: hereinafter referred to as MOS transistor). By connecting a pull up resistor (not shown) to the output terminal OUT, a high level or low level signal (reset signal) is generated according to the on/off state of the output transistor M0 and the signal is transmitted to the reset terminal, etc. of the IC composing the system. Specifically, when the direct voltage VDD is lower than the predetermined electric potential, a low level signal is output, and when the direct voltage VDD is higher than the predetermined electric potential, a high level (cancel level) signal is output. Then, when a predetermined delay time passes after detecting the direct voltage VDD changed from the electric potential lower than the predetermined electric potential to the electric potential higher than the predetermined electric potential, the output signal changes from the low level to the high level.

The reference voltage circuit 11 includes a reference voltage generating circuit in which a constant voltage circuit including zener diode or a depression MOS transistor which operates as a constant current source is connected in series with an enhancement MOS transistor.

A N channel MOS transistor M1 which applies a hysteresis so that false operation of the comparator 13 does not occur due to fine change of the voltage VDD is connected parallel to R3 among the resistors R1, R2, and R3 composing the resistor voltage dividing circuit 12.

Regarding the comparator 13, reference voltage Vref from the reference voltage circuit 12 is input to the inverting input terminal and a voltage divided by the resistor voltage circuit 12 is input to the non-inverting input terminal. A value of the reference voltage Vref and a division ratio of the resistor voltage dividing circuit 12 are set so that the output of the comparator 13 changes when the voltage VDD is a predetermined electric potential.

The constant current circuit 14 includes a constant current source CI2 and a pair of switches SW1 and SW2 connected in a series with the constant current source CI2, a P channel MOS transistor M2 where the channel is connected in a series with the above elements and the source terminal is connected to the voltage input terminal IN, another similar P channel MOS transistor M3 where the transistor M2 and gate terminal are connected to each other with a common connection and a N channel MOS transistor M4 connected in a series with the MOS transistor M3.

The drain terminal of the MOS transistor M3 is connected to the external terminal CD, and an output signal of an inverter INV1 which inverts the output of the comparator 13 is applied to the gate terminal of the MOS transistor M4. Here, it is preferable that the electric current flown in the constant current source CI2 is as small as possible from the viewpoint of reducing consumption of electric current. The switch SW1 can be configured with the P channel MOS transistor and the switch SW2 can be configured with the N channel MOS transistor.

According to the present embodiment, the gate terminal and the drain terminal of the transistor M2 among the above transistors M2 to M4 are connected and functions as the voltage current conversion element. Moreover, a common connection is made between the gate terminals of M2 and M3 so that M2 and M3 function as a current mirror circuit which flows electric current according to the size ratio.

The size of the transistor M2 is a size large enough to flow electric current of the constant current source CI2, and the size ratio between the transistors M2 and M3 is set so that a time constant determined by the drain current which flows to M3 and capacitance value of the condenser connected to the external terminal CD, in other words delay time of the circuit is to be a predetermined delay time.

Further, a P channel MOS transistor M5 is provided in parallel with the MOS transistor M3 composing the current mirror in the constant current circuit 14 of the present embodiment. An input terminal of an inverter INV2 composing the judgment circuit 15 is connected to a common drain terminal (node N1 connected to the external terminal CD) of the MOS transistors M5 and M3 and a control signal from the judgment circuit 15 is applied to the gate terminal of the MOS transistor M5.

The judgment circuit 15 includes the inverter INV2, a RS flip-flop FF1 where the output signal of the inverter INV2 is input to the set terminal, and an inverter INV3 which inverts normal phase side output Q of the flip-flop FF1 to supply the output to the gate terminal of the output transistor M0. The reverse phase side output/Q of the flip-flop FF1 is applied to the gate terminal of the MOS transistor M5 and the control terminal of the switch SW2. A comparator can be used instead of the inverter INV2. The RS flip-flop FF1 is provided to prevent chattering where noise is attached to the output of the inverter INV2 and the output transistor M0 repeats on and off, and can be omitted.

Next, the operation of the low voltage detection circuit 10 as configured above is described with reference to FIG. 3.

In the low voltage detection circuit 10 shown in FIG. 1, when the low voltage is detected, in other words, when the voltage VDD applied to the voltage input terminal IN is lower than the predetermined electric potential (timing t1 shown in FIG. 3A), as shown in FIG. 3B, the output CMP of the comparator 13 changes to low level and the switch SW1 of the constant current circuit 14 turns off, and the electric current does not flow to the constant current circuit 14. At this time, as shown in FIG. 3C, since the output B of the inverter INV1 changes to a high level and the transistor M4 is set to an on state, the charge of the condenser connected to the external terminal CD is pulled out, and as shown in FIG. 3D, the electric potential Vc of the node N1 changes toward the ground potential (low level). When the electric potential Vc of the node N1 becomes a logic threshold of the inverter INV2 or lower, the flip-flop FF1 is set to a reset state by the inverter INV2.

Then, as shown in FIG. 3E, the normal phase side output Q of the flip-flop FF1 becomes a low level, and the output transistor M0 is set to an on state by the inverter INV3 and the electric potential Vout of the output terminal OUT is set to a low level (reset state). As shown in FIG. 3F, the reverse phase side output/Q of the flip-flop FF1 becomes a high level and the switch SW2 is set to an on state and the MOS transistor M5 is set to an off state. With this, a through current passing through the MOS transistors M5 and M4 can be prevented and the electric potential Vc of the node N1 is lowered to the ground potential.

Next, when the voltage VDD applied to the voltage input terminal IN is a voltage higher than the predetermined electric potential (timing t2 shown in FIG. 3A, as shown in FIG. 3B, the output of the comparator 13 changes to a high level and turns on the switch SW1 of the constant current circuit 14. At this time, as described above, since the switch SW2 is in an on state, the electric current I2 of the constant current source CI2 is flown to the ground point. Since the MOS transistor M4 is set to an off state by the inverter INV1 which inverts the output of the comparator 13, the charging of the condenser connected to the external terminal CD is started with the electric current copied by the current mirror of M2, M3.

Figure 3:
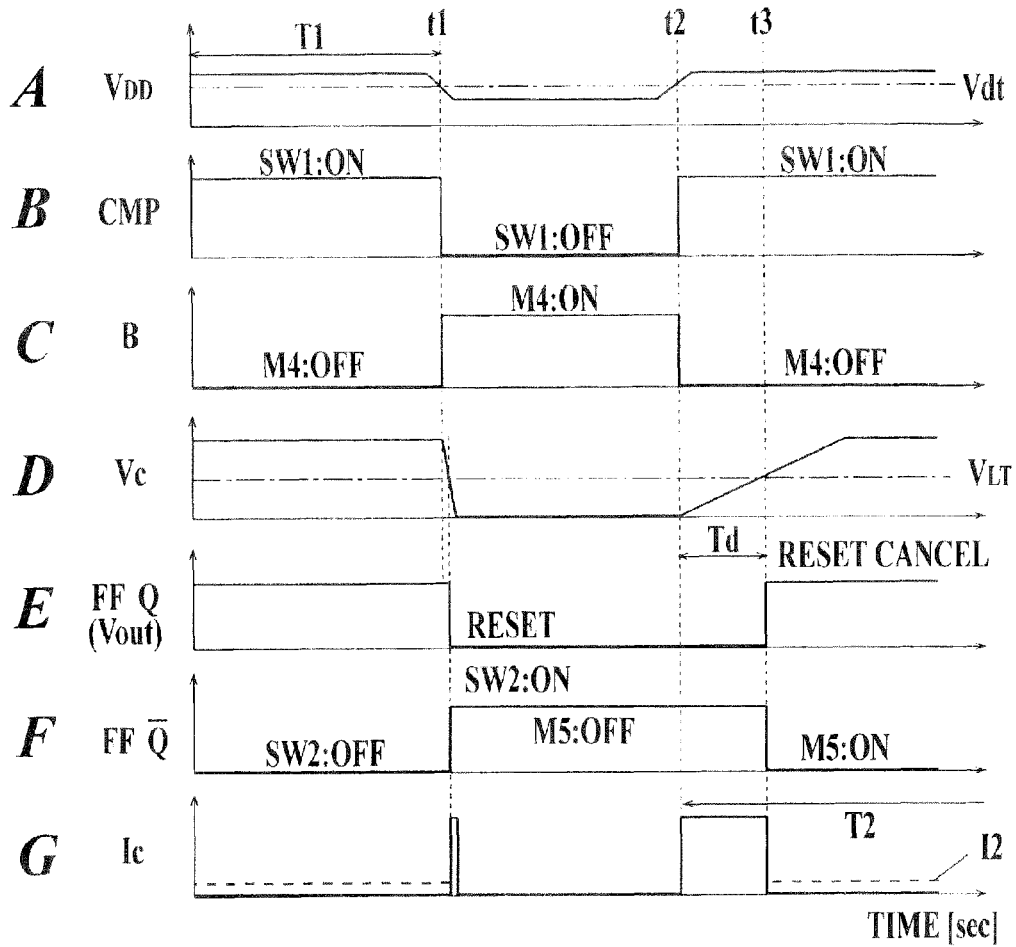
FIG. 3 is a timing chart showing change of voltage and signal of each section of the low voltage detection circuit shown in FIG. 1 and change of electric current consumption of the constant current circuit.

After passing of a predetermined delay time Td (timing t3 shown in FIG. 3) determined by the electric current value of the MOS transistor M3 and the time constant of the capacitance value of the condenser from the point when the output of the comparator 13 changes to the high level (timing t2 shown in FIG. 3), as shown in FIG. 3D, the electric potential Vc of the node N1 exceeds the logic threshold VLT of the inverter INV2 and the flip-flop FF1, and as shown in FIG. 3E, the normal phase side output Q of the FF1 changes to the high level. With this, the output transistor M0 is set to an on state, and the electric potential of the output terminal OUT changes to the high level (reset cancel state). At this time, as shown in FIG. 3F, the reverse phase side output/Q of the flip-flop FF1 becomes the low level, and the switch SW2 is set to the off state. Therefore, even if the switch SW1 is turned on, the electric current does not flow in the constant current circuit 14.

Figure 6:
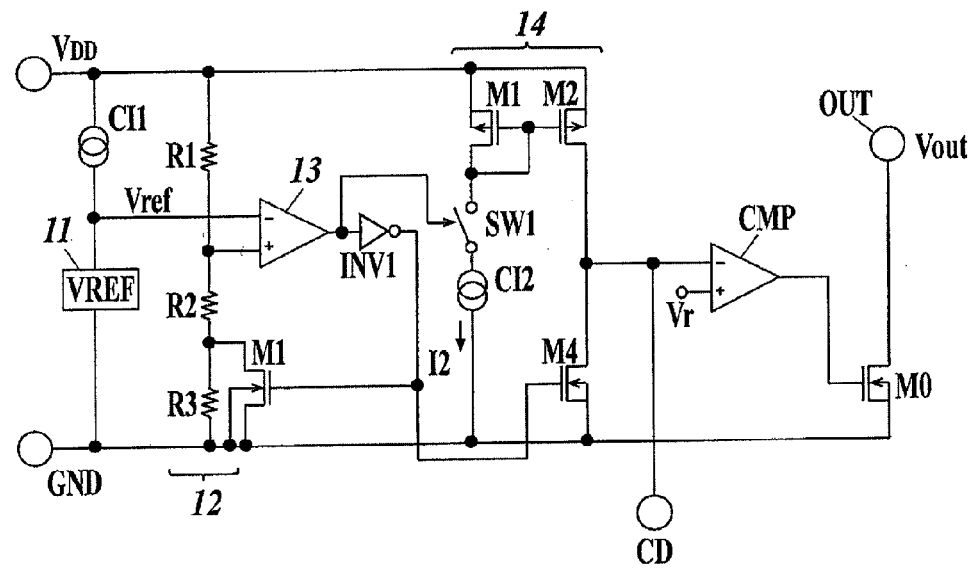
FIG. 6 is a circuit structure diagram showing an example of a technique to reduce consumption of the electric current in the conventional type of low voltage detection circuit including delay.

FIG. 3G shows a change of the electric current Ic which flows through the entire constant current circuit 14. In the low voltage detection circuit (FIG. 6) of the type with low electric current consumption and not provided with the switch SW2, during the terms T1, T2 while the switch SW1 is turned on, as shown with broken lines in FIG. 3G, the electric current (a few hundred nA) in the amount of the electric current I2 of the constant current source CI2 is flown. However, in the low voltage detection circuit (FIG. 1) of the present embodiment, in the term other than the term Td among the terms T1, T2, the switch SW2 is set to an off state, and as shown with solid lines in FIG. 3G, the electric current of the constant current circuit 14 is hardly flown and consumption of electric current can be reduced.

When the switch SW2 is turned off and the electric current to the constant current circuit 14 is cut, in a circuit without the MOS transistor M5, the electric potential of the node N1 becomes unstable. However, in the low voltage detection circuit of the present embodiment (FIG. 1), after the timing t3, the MOS transistor M5 is set to the on state by the reverse phase side output/Q of the flip-flop FF1 (low level). Therefore, the electric potential of the node N1 becomes the voltage VDD applied to the voltage input terminal IN and the input electric potential of the set side of the flip-flop FF1 is maintained in the high level state. Therefore, the normal phase side output Q of the flip-flop FF1 becomes stable in the high level and it is possible to avoid the problem of the electric potential of the node N1 becoming unstable due to providing the switch SW2.

Figure 2:
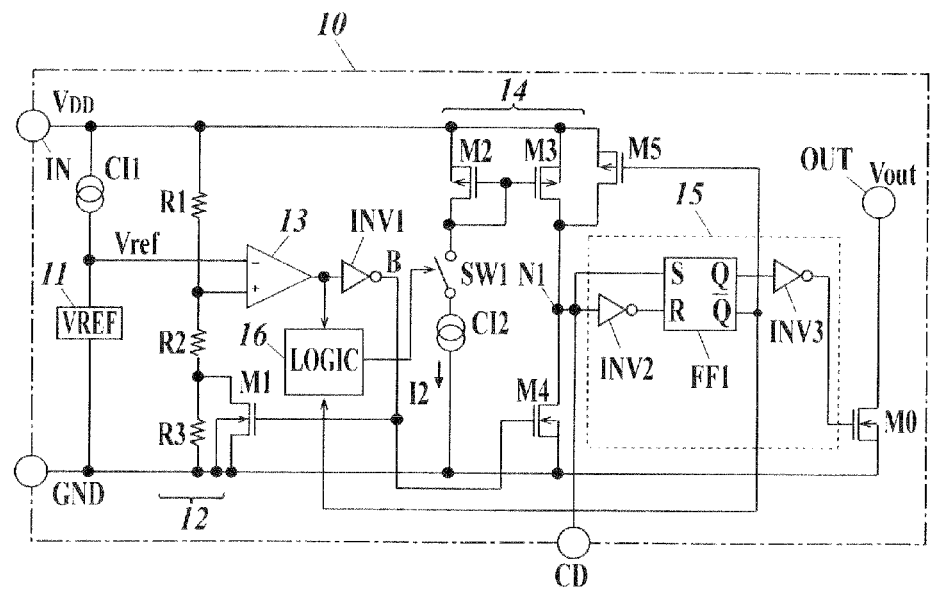
FIG. 2 is a circuit structure diagram showing a modification of the low voltage detection circuit of the embodiment shown in FIG. 1.

FIG. 2 shows a modification of the low voltage detection circuit 10 of the present embodiment. The modification omits the switch SW2 from the constant current circuit 14 shown in FIG. 1, but provides a logic circuit 16 in which the input is to be the output of the comparator 13 and the reverse phase side output/Q of the flip-flop FF1 of the judgment circuit 15. The output of the logic circuit 16 controls the on and off of the switch SW1.

The logic circuit 16 of the modification is to include logic which outputs a signal to turn on the switch SW1 at the timing when the switch SW1 shown in FIG. 1 is turned on, and to turn off the switch SW1 at the timing when the switch SW2 is turned off. With this, it is possible to achieve operation which is the same as the circuit shown in FIG. 1.

Figure 4:
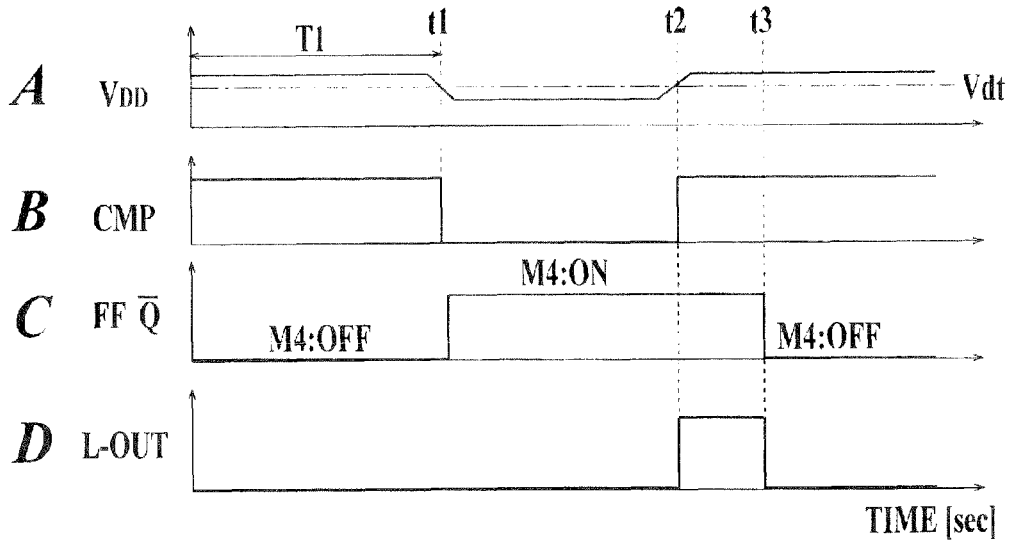
FIG. 4 is a timing chart showing change of voltage and signal of the main section of the low voltage detection circuit shown in FIG. 2.
Figure 5:
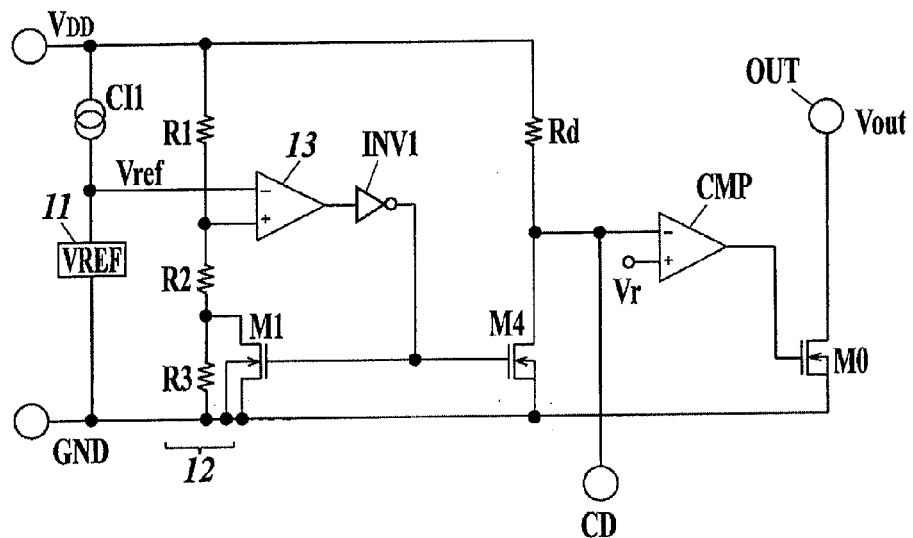
FIG. 5 is a circuit structure diagram showing an example of a conventional type of low voltage detection circuit including delay.

FIG. 4 shows a relation between the change of the output CMP of the comparator 13 and the reverse phase side output/Q of the flip-flop FF1 which is the input signal of the logic circuit 16 and the change of the output signal L-OUT of the logic circuit 16. From FIG. 4, it is possible to understand that the logic circuit 16 is to include logic which outputs the high level only when both the output CMP of the comparator 13 and the reverse phase side output/Q of the flip-flop FF1 are in the high level term. Such logic circuit can be realized by, for example, an AND gate circuit.

According to the configuration as shown in FIG. 2, the number of vertically stacked transistors in the electric current path including the constant current source CI2 of the constant current circuit 14 can be reduced compared to the configuration shown in FIG. 1. With this, the advantage is that it is possible to enlarge the operation voltage range of the low voltage detection circuit (specifically, the lower limit voltage).

The present invention by the inventors has been specifically described based on the embodiment, however, the present invention is not limited to the above embodiment. For example, the above embodiment shows an example using the MOS transistor as the transistor which composes the circuit.

However, the present invention can be employed in the circuit using the bipolar transistor instead of the MOS transistor.

Moreover, the present embodiment describes using the MOS transistor of the open drain as the output stage, however, other formats such as the CMOS inverter can be used.

The embodiment of FIG. 1 shows an example which controls on and off of the switch SW2 provided in series with the constant current source CI2 by the reverse phase side output/Q of the flip-flop FF1. However, the on and off can be controlled by the output of the inverter INV3 which drives the output transistor M0. In the present embodiment, the MOS transistor M1 which applies the hysteresis is provided in the comparator 13. However, instead of providing the MOS transistor M1, it is possible to use a member which includes hysteresis attributes as the comparator 13.

The above description describes an example of applying the present invention to the reset IC which outputs a signal showing that the low voltage state of the power source voltage is detected. However, the present invention is not limited to the above, and can be widely used in an IC including the low voltage detection circuit.

According to the present invention, it is possible to suppress consumption of electric current by not flowing electric current of the constant current source after the output is a cancel state when a predetermined amount of time passes with the power source voltage being a predetermined electric potential or more in a low voltage detection circuit including a delay in which a delay time can be set so that the delay time does not receive influence of variation in element or temperature attributes by charging a condenser with a constant current.

According to an aspect of the present invention, there is provided a low voltage detection circuit including:

a voltage comparison circuit which compares a voltage in proportion to a voltage of a detection target with a predetermined reference voltage;

an output stage which outputs a detection result;

an electric current circuit which includes a constant current source and which obtains a predetermined delay time by charging a condenser with a constant current;

a judgment circuit which judges that a charging electric potential of the condenser reaches a predetermined electric potential, wherein when the voltage comparison circuit detects that the voltage of the detection target is a predetermined voltage value or less, an output state of the output stage is promptly changed;

when the voltage comparison circuit detects that the voltage of the detection target is a predetermined voltage value or more, the output state of the output stage is changed after a delay time obtained by the electric current circuit;

when the voltage comparison circuit detects that the voltage of the detection target is a predetermined voltage value or less, the electric current circuit is set to a state in which the electric current of the constant current source is cut; and when the voltage comparison circuit detects that the voltage of the detection target is a predetermined voltage value or more, the electric current circuit is set to a state in which the electric current of the constant current source is flown, the charging of the condenser is started, and a control signal from the judgment circuit cuts the electric current flown in the constant current source after the delay time.

According to the above, when it is detected that the voltage of the detection target is a predetermined voltage value or more in a low voltage detection circuit which changes the output state after the delay time by the electric current circuit which obtains a predetermined delay time by charging the condenser with the constant current, when the low voltage is detected, the electric current flown in the constant current source is cut after a predetermined delay time passes and the output state changes. Therefore, it is possible to reduce consumption of electric current of the electric current circuit.

Preferably, in the low voltage detection circuit, the electric current circuit includes:

a first switch section which is controlled based on output of the voltage comparison circuit to be able to conduct or cut the electric current flown in the constant current source;

a first transistor which is connected in series with the constant current source;

a second transistor which is connected to compose a current mirror circuit with the first transistor to flow an electric current in proportion with the electric current flown in the constant current source;

a third transistor connected in series with the second transistor; and a fourth transistor connected parallel with the second transistor, wherein when the voltage comparison circuit detects that the voltage of the detection target is a predetermined voltage value or less, the first switch section is set to a state in which the electric current is cut, the third transistor is set to an on state and the fourth transistor is set to an off state; and when the voltage comparison circuit detects that the voltage of the detection target is a predetermined voltage value or more, the first switch section is set to a state in which the electric current is conducted, the third transistor is set to an off state, the electric current circuit starts the charging of the condenser and after the delay time, the judgment circuit outputs a control signal to cut the electric current flown in the constant current source, and in addition, the fourth transistor is set to an on state.

With this, after the low voltage is detected, a predetermined delay time passes and the output state changes, the electric current flown in the constant current source is cut and it is possible to decrease consumption of electric current of the electric current circuit. Moreover, the fourth transistor which is connected in parallel with the second transistor composing the current mirror circuit is in a conducted state when the electric current flown in the constant current source is cut. Therefore, it is possible to prevent the electric potential of the node in the electric current circuit becoming unstable and the judgment circuit in the later stage causing false operation due to the electric current flown in the constant current source being cut.

Preferably, in the low voltage detection circuit, the electric circuit includes:

a second switch section provided in series with the constant current source, wherein the output of the voltage comparison circuit controls the on and off of the switch section; and the signal from the judgment circuit controls the on and off of the second switch section and the fourth transistor.

With this, by simply adding a second switch section in series with the constant current source, it is possible to easily cut the electric current flown in the constant current source after the low voltage is detected, the predetermined delay time passes and the output state changes.

Preferably, the low voltage detection circuit further includes a logic circuit which generates a signal to control on and off of the switch section based on the output of the voltage comparison circuit and the signal from the judgment circuit.

With this, when implementing a circuit which cuts electric current flown in the constant current source after the low voltage is detected, the predetermined delay time passes and the output state is changed, it is possible to reduce the number of vertically stacked transistors in the electric current path including the constant current source of the electric current circuit, and it is possible to enlarge the operation voltage range (specifically, the lower limit voltage) of the low voltage detection circuit.

Preferably, in the low voltage detection circuit, the judgment circuit includes:

an inverter in which input is charging electric potential of the condenser; and a flip-flop in which the charging electric potential of the condenser or a signal corresponding to the charging electric potential of the condenser is input to a set terminal and an output signal of the inverter is input to a reset terminal,
wherein
a normal phase side output of the flip-flop controls the output stage; and
a reverse phase side output of the flip-flop controls the on and off of the fourth transistor.

With this, it is possible to prevent the problem of the output by noise changing and it is possible to realize a judgment circuit with a relatively small circuit scale compared to using a comparator as a judgment section.

The entire disclosure of Japanese Patent Application No. 2011-233475 filed on Oct. 25, 2011 including description, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A low voltage detection circuit comprising:
a voltage comparison circuit which compares a voltage in proportion to a detection target voltage with a predetermined reference voltage;
an output stage which outputs a detection result;
an electric current circuit which includes a constant current source and which obtains a predetermined delay time by charging a condenser with a constant current; and
a judgment circuit which judges that a charging electric potential of the condenser reaches a predetermined electric potential;
wherein:
when the voltage comparison circuit detects that the detection target voltage becomes the predetermined reference voltage or less, an output state of the output stage is promptly changed;
when the voltage comparison circuit detects that the detection target voltage becomes the predetermined reference voltage or more, the output state of the output stage is changed after the delay time obtained by the electric current circuit;
when the voltage comparison circuit detects that the detection target voltage becomes the predetermined reference voltage or less, the electric current circuit is set to a state in which the electric current of the constant current source is cut; and
when the voltage comparison circuit detects that the detection target voltage becomes the predetermined reference voltage or more, the electric current circuit is set to a state in which the electric current of the constant current source is flown, the charging of the condenser is started, and a control signal from the judgment circuit cuts the electric current flown in the constant current source after the delay time;
wherein the electric current circuit includes:
a first switch section which is controlled based on an output of the voltage comparison circuit to be able to conduct or cut the electric current flown in the constant current source;
a first transistor which is connected in series with the constant current source;
a second transistor which is connected to compose a current mirror circuit with the first transistor to flow an electric current in proportion with the electric current flown in the constant current source;
a third transistor connected in series with the second transistor; and
a fourth transistor connected in parallel with the second transistor; and
wherein:
when the voltage comparison circuit detects that the detection target voltage becomes the predetermined reference voltage or less, the first switch section is set to a state in which the electric current is cut, the third transistor is set to an on state and the fourth transistor is set to an off state; and
when the voltage comparison circuit detects that the detection target voltage becomes the predetermined reference voltage or more, the first switch section is set to a state in which the electric current is conducted, the third transistor is set to an off state, the electric current circuit starts the charging of the condenser and after the delay time, the judgment circuit outputs a control signal to cut the electric current flown in the constant current source, and in addition, the fourth transistor is set to an on state.

2. The low voltage detection circuit according to claim 1, further comprising a logic circuit which generates a signal to control on and off of the first switch section based on an output of the voltage comparison circuit and the control signal from the judgment circuit.

3. The low voltage detection circuit according to claim 1, wherein:
the electric current circuit further includes a second switch section provided in series with the constant current source;
an output of the voltage comparison circuit controls the on and off of the first switch section; and
the control signal from the judgment circuit controls the on and off of the second switch section and the fourth transistor.

4. The low voltage detection circuit according to claim 2, wherein the judgment circuit includes:
an inverter an input of which is the charging electric potential of the condenser; and
a flip-flop in which the charging electric potential of the condenser or a signal corresponding to the charging electric potential of the condenser is input to a set terminal and an output signal of the inverter is input to a reset terminal;
wherein a normal phase side output of the flip-flop controls the output stage; and
wherein a reverse phase side output of the flip-flop controls the on and off of the fourth transistor.

* * * * *